(12) United States Patent
Miller

(10) Patent No.: US 7,239,220 B2
(45) Date of Patent: *Jul. 3, 2007

(54) ADJUSTABLE DELAY TRANSMISSION LINE

(75) Inventor: Charles A. Miller, Fremont, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/422,565

(22) Filed: Jun. 6, 2006

(65) Prior Publication Data

US 2006/0208830 A1 Sep. 21, 2006

Related U.S. Application Data

(63) Continuation of application No. 10/985,474, filed on Nov. 9, 2004, now Pat. No. 7,057,474, which is a continuation of application No. 10/006,178, filed on Dec. 4, 2001, now Pat. No. 6,816,031.

(51) Int. Cl.
*H01P 9/00* (2006.01)
(52) U.S. Cl. .................................. 333/164; 333/156
(58) Field of Classification Search ............... 333/164, 333/156
See application file for complete search history.

(56) References Cited

U.S. PATENT DOCUMENTS

| | | | |
|---|---|---|---|
| 3,400,342 A | 9/1968 | Putnam | |
| 3,882,431 A | 5/1975 | Hopwood et al. | |
| 4,288,763 A | 9/1981 | Hopfer | |
| 4,472,725 A | 9/1984 | Blumenkranz | |
| 4,523,312 A | 6/1985 | Takeuchi | |
| 4,559,489 A | 12/1985 | Vacanti et al. | |
| 4,701,714 A * | 10/1987 | Agoston | 327/277 |
| 4,799,034 A | 1/1989 | Silverman et al. | |
| 4,829,272 A | 5/1989 | Kameya | |
| 5,006,821 A | 4/1991 | Tam | |
| 5,066,930 A * | 11/1991 | Morse | 333/164 |
| 5,086,271 A | 2/1992 | Haill et al. | |
| 5,146,192 A | 9/1992 | Kondo et al. | |
| 5,162,728 A | 11/1992 | Huppenthal | |
| 5,235,295 A | 8/1993 | Barbaste et al. | |
| 5,302,922 A | 4/1994 | Heidemann et al. | |
| 5,309,019 A * | 5/1994 | Moline et al. | 257/670 |
| 5,424,693 A | 6/1995 | Lin | |
| 5,448,210 A * | 9/1995 | Marcoux | 333/205 |
| 5,576,669 A | 11/1996 | Ruelke | |
| 5,640,042 A | 6/1997 | Koscica et al. | |
| 5,729,150 A | 3/1998 | Schwindt | |
| 5,760,661 A * | 6/1998 | Cohn | 333/164 |

(Continued)

FOREIGN PATENT DOCUMENTS

EP 513992 11/1992

(Continued)

*Primary Examiner*—Robert Pascal
*Assistant Examiner*—Kimberly E Glenn
(74) *Attorney, Agent, or Firm*—N. Kenneth Burraston

(57) ABSTRACT

A transmission line includes a signal conductor and at least one varactor diode capacitively coupled to the signal conductor. The transmission line's signal path delay is a function of its shunt capacitance, and the varactor's capacitance forms a part of the transmission line's shunt capacitance. The transmission line's signal path delay is adjusted by adjusting a control voltage across the varactor diode thereby to adjust the varactor diode's capacitance.

15 Claims, 7 Drawing Sheets

U.S. PATENT DOCUMENTS

Figure 1:
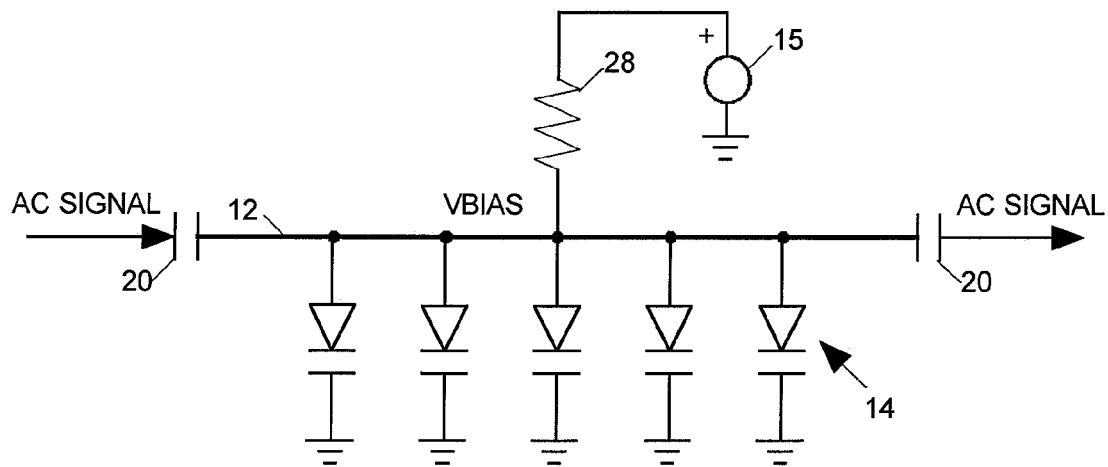

| | | |
|---|---|---|
| 5,856,769 A | 1/1999 | Kiser |
| 5,869,898 A | 2/1999 | Sato |
| 5,942,950 A * | 8/1999 | Merenda .................. 331/99 |
| 5,969,929 A | 10/1999 | Kleveland et al. |
| 5,974,662 A | 11/1999 | Eldridge et al. |
| 5,994,766 A | 11/1999 | Shenoy et al. |
| 6,008,533 A | 12/1999 | Bruce et al. |
| 6,114,920 A | 9/2000 | Moon et al. |
| 6,160,412 A | 12/2000 | Martel et al. |
| 6,211,541 B1 | 4/2001 | Carrol et al. |
| 6,263,198 B1 | 7/2001 | Li |
| 6,483,398 B2 | 11/2002 | Nagamori et al. |
| 6,816,031 B1 | 11/2004 | Miller |
| 7,057,474 B2 | 6/2006 | Miller |

FOREIGN PATENT DOCUMENTS

| | | |
|---|---|---|
| GB | 2303495 | 2/1997 |
| JP | 4-107940 | 4/1992 |
| WO | WO 97/44676 | 11/1997 |
| WO | WO 00/50905 | 8/2000 |
| WO | WO 00/51012 | 8/2000 |
| WO | WO 00/51232 | 8/2000 |
| WO | WO 01/73929 | 10/2001 |

* cited by examiner

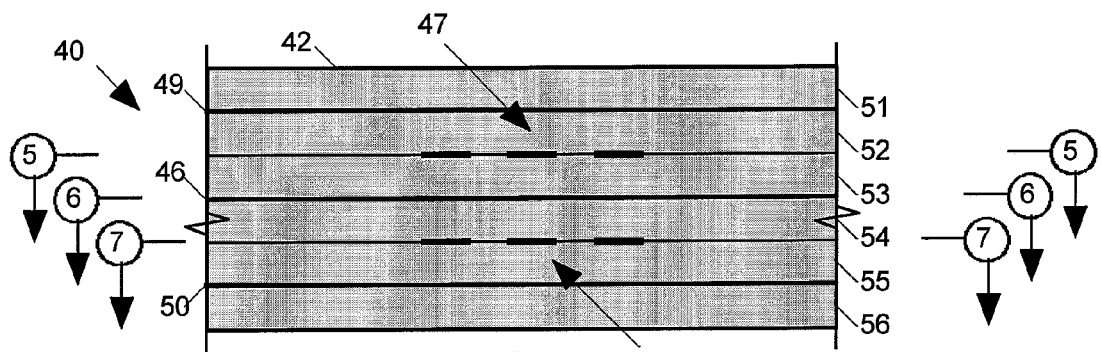
FIG. 3
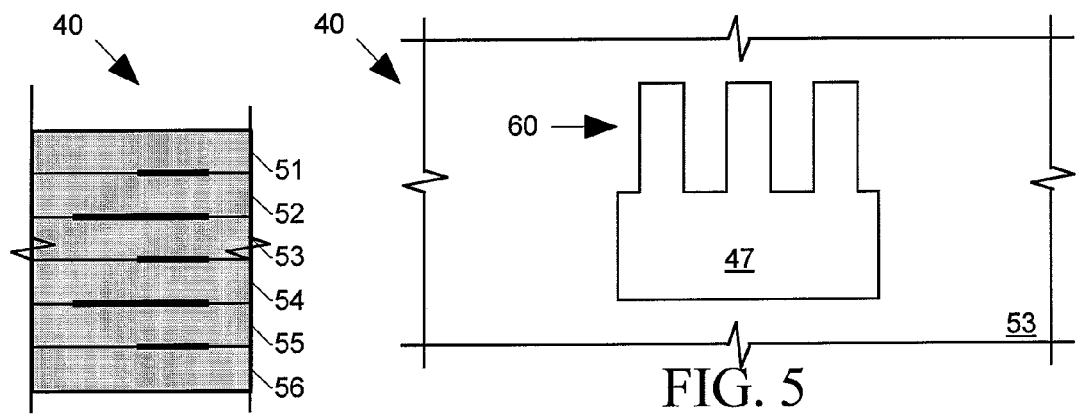
FIG. 4
FIG. 5
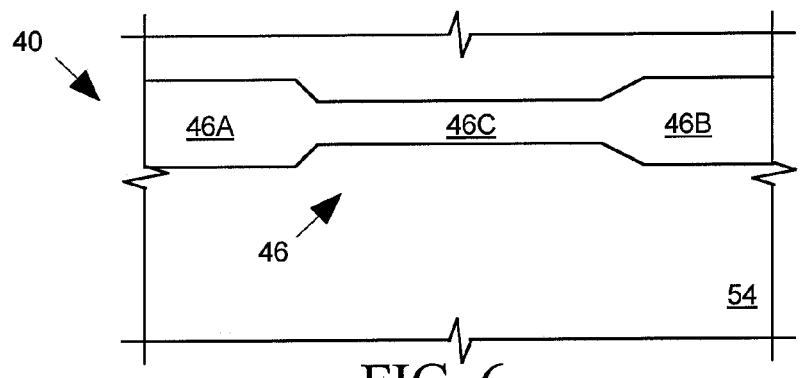
FIG. 6
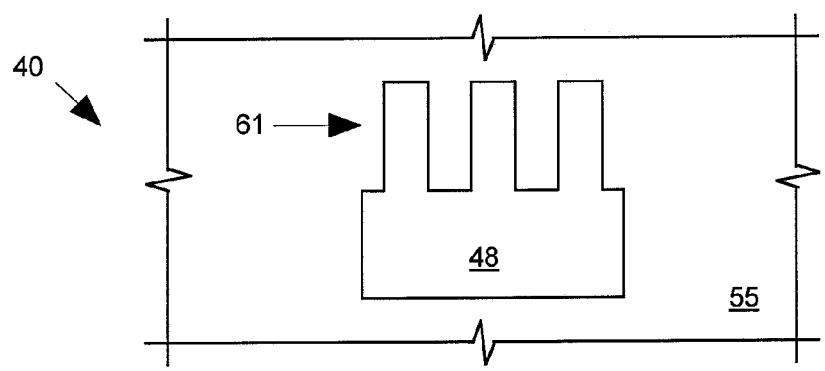
FIG. 7

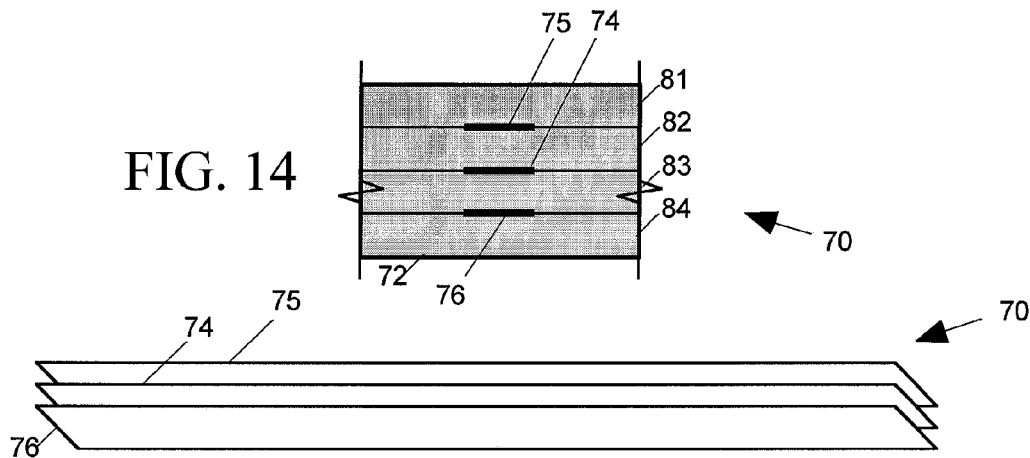
FIG. 14
FIG. 15
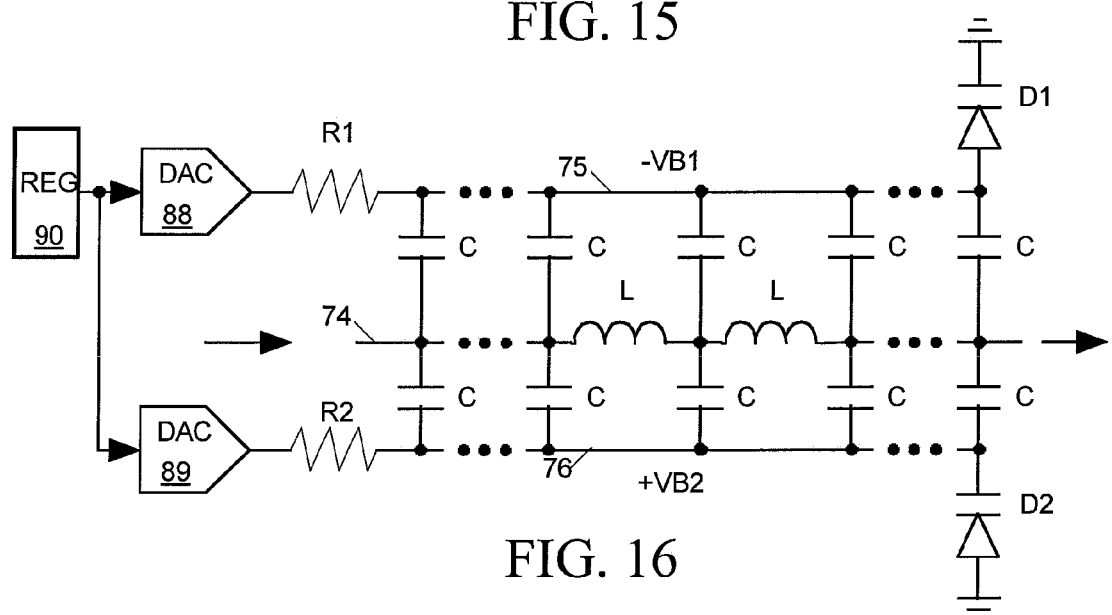
FIG. 16
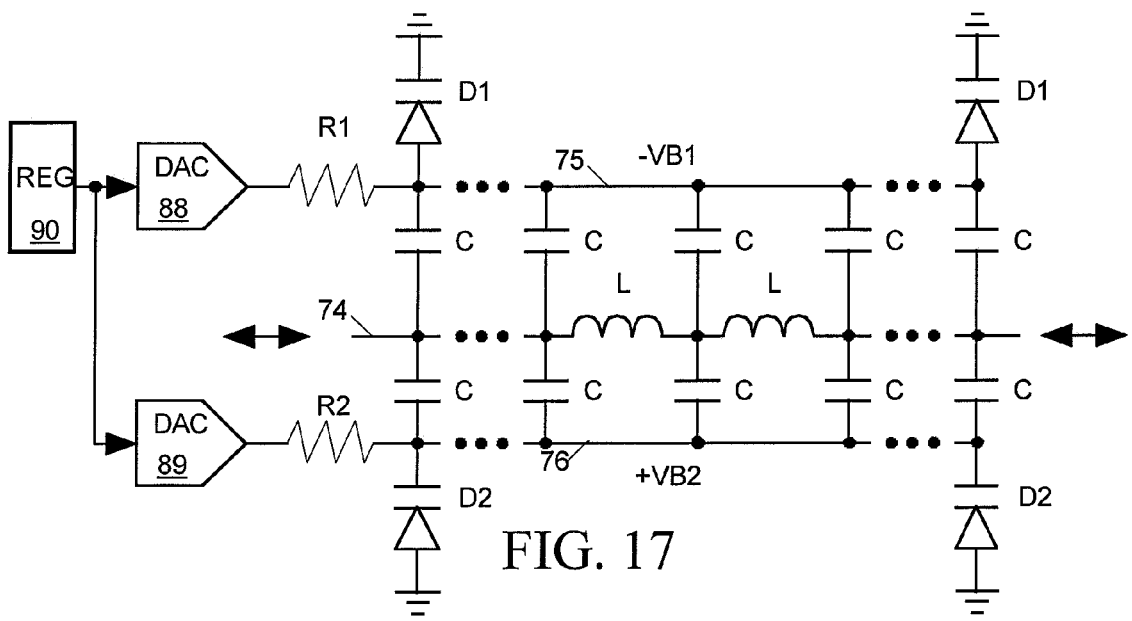
FIG. 17

ADJUSTABLE DELAY TRANSMISSION LINE

CROSS-REFERENCE TO RELATED APPLICATIONS

This application is a continuation of U.S. patent application Ser. No. 10/985,474, filed Nov. 9, 2004 (now U.S. Pat. No. 7,057,474), which is a continuation of U.S. patent application Ser. No. 10/006,178, filed Dec. 4, 2001 (now U.S. Pat. No. 6,816,031).

BACKGROUND OF THE INVENTION

1. Field of the Invention

The present invention relates in general to transmission lines for conveying high frequency signals, and in particular to a method and apparatus for adjusting the signal path delay of a transmission line.

2. Description of Related Art

Controlled impedance transmission lines are often used to convey high frequency digital signals between signal transmitters and receivers within an electronic circuit. The "characteristic impedance" $Z_0$ of a uniform transmission line is often modeled as $$Z_0 = (L/C)^{1/2} \quad [1]$$

where L and C are the series inductance and shunt capacitance per unit length of the transmission line. Since abrupt changes in the characteristic impedance of a transmission line can cause undesirable signal reflections, circuit designers usually try to design transmission lines so that they have a uniformly distributed characteristic impedance from end-to-end. They also design the circuits at each end of a transmission line to terminate the transmission line with its characteristic impedance to avoid abrupt impedance changes at the transmission line ends.

When a driver sends a pulse edge of a digital signal to a receiver at a remote end of a transmission line, the pulse edge takes time to travel the length of a transmission line to the receiver because the driver needs time to change the charge on capacitance of the transmission line and to alter the magnetic fields in the transmission line inductance that oppose voltage changes on the transmission line. The velocity of signal propagation $V_p$ of a transmission line having uniform distributed capacitance C and inductance L per unit length can be modeled by the expression:

$$V_p = (1/LC)^{1/2} \quad [2]$$

In many applications it is necessary to precisely control the signal path delay of a transmission line. For example an integrated circuit (IC) tester that tests an IC die on a semiconductor wafer sends test signals to the IC die under test (DUT) and samples output signals the DUTs produce in response to the test signals to determine whether the DUT is behaving as expected. The test and response signals travel over transmission lines between the tester and bond pads on the DUT surfaces that act as input/output terminals. The transmission lines include probes for accessing the DUT bond pads and various connectors and circuit board traces for linking the tester to the probes. Since the tester must carefully control the times at which test signal state changes arrive at the DUT and the times at which the tester must sample each response signal, the signal path delay of the transmission lines becomes increasingly large and problematic with increasing test and response signal frequencies. For example when the tester changes the state of two test signals at the same time, the state changes of those two test signals should arrive at separate terminals of a DUT acceptably close together in time. It helps to use transmission lines of similar design and length to convey the two signals from their sources in the tester to the DUT. However in high frequency testing environments, where signals timing must be accurate within the picosecond range, it is difficult to construct a set of transmission lines having sufficiently similar signal path delays.

One solution to the problem is to provide transmission lines having adjustable delays. As illustrated in FIG. 1 herein, U.S. Pat. No. 5,760,661 issued Jun. 2, 1998 to Marvin Cohn, describes a transmission line 10 including a trace 12 formed on a semiconductor substrate for conveying high frequency alternating current (AC) signals. As may be seen from equation [2] above, since the velocity of signal propagation $V_p$ is inversely proportional to the square root of its capacitance, it is possible to control a transmission line's delay by adjusting its capacitance. A varactor diode acts like a capacitor having a capacitance that is a function of the voltage across it. Cohn teaches to connect varactor diodes 14 at various points along the trace 12 so that the capacitance of the varactor diodes increases the inherent capacitance of the trace. A pair of capacitors 20 at the ends of trace 12 block direct current (DC) signals but allow an AC input signal to pass over the trace. This prevents the common mode voltage of the AC signal from influencing the bias on diodes 14. A DC control voltage $V_{BIAS}$ delivered to trace 12 from an adjustable voltage source 15 through a resistor 28 controls the capacitance of the varactor diodes and therefore the delay of transmission line 10. Thus the delay of transmission line 10 can be adjusted by adjusting the DC control voltage $V_{BIAS}$ on trace 12. Although changing the capacitance of transmission line 10 also changes the transmission line's characteristic impedance, small reflections resulting from small mismatches in characteristic impedance can often be tolerated when small variations in signal path delay cannot.

Since the voltage of an AC signal having a larger peak-to-peak voltage can substantially increase or decrease the voltage across varactor diodes 14 depending on whether the AC signal is in its high or low voltage swing, the delay provided by transmission line 10 varies with the phase of the AC signal, and that kind of delay variation can distort the signal. Cohn resolves this problem by modifying transmission line 10 of FIG. 1 to form the transmission line 30 illustrated in FIG. 2. Here varactor diodes 32 of opposite polarity to that of varactor diodes 14 are also connected to trace 12. Any change in capacitance of varactor diodes 14 arising from variation in the AC signal voltage is offset by a substantially equal but opposite change in the capacitance of varactor diodes 32. Thus the total capacitance of the transmission line 30 is largely unaffected by the phase of the AC signal. by the cited patent are suitable for conveying high frequency sine wave signals, but they are not suitable for conveying other types of high frequency signals, such as binary digital signals. Versions of the transmission line employing isolation capacitors 20 would block or substantially distort such signals. Thus versions of the transmission line that do not employ blocking diodes add a DC offset to the voltage of the signal that may not be acceptable in many applications. Versions of the transmission line employing isolation capacitors to remove the DC offset would substantially distort high frequency signals that were not sine waves.

Figure 2:
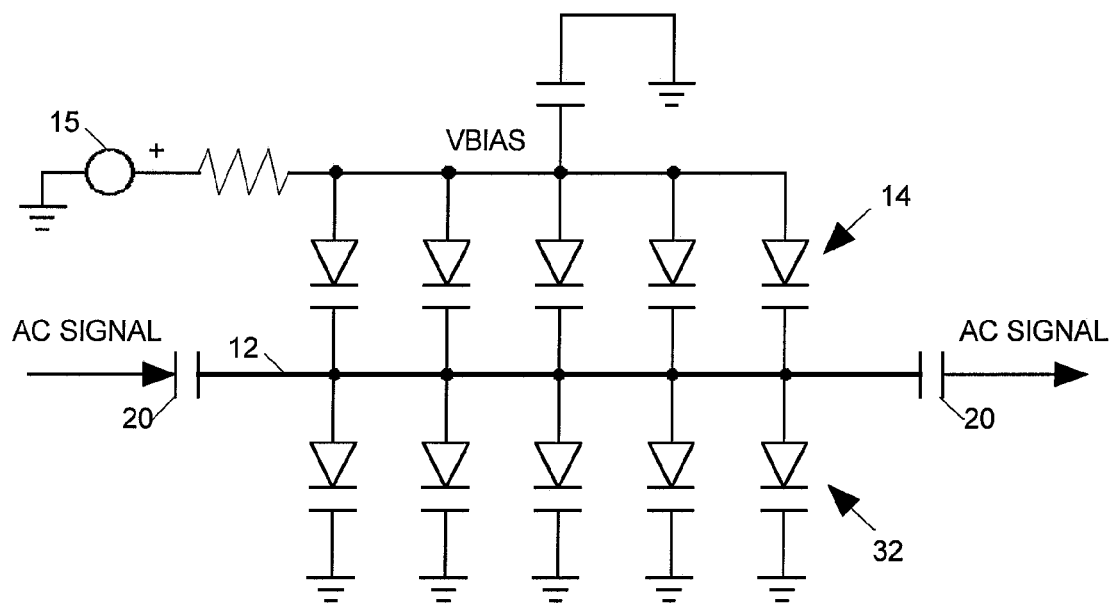

One drawback to the prior art transmission lines illustrated in FIGS. 1 and 2 is that they require relatively large numbers of discrete varactors to be distributed along the length of the transmission lines. Such transmission lines are expensive and difficult to fabricate.

What is needed is a transmission line having an adjustable signal path delay that is suitable for conveying all types of high frequency signals including but not limited to digital signals, analog signals, square waves signals, sine wave signals and combinations thereof, and which does not require the use of large numbers of expensive varactors.

BRIEF SUMMARY OF THE INVENTION

An adjustable delay transmission line in accordance with the invention includes a signal conductor for conveying a signal, one or two coupling conductors positioned near the signal conductor and varactor diodes connected between ground potential and the coupling conductors. The coupling conductors capacitively couple the varactor diodes to the signal conductor so that the varactor diode capacitance forms a part of the transmission line's shunt capacitance and influences the transmission line's signal path delay. The magnitudes of a control voltages placed on the coupling conductors controls the varactor's capacitance and therefore controls the transmission line's signal path delay.

The transmission line is suitable for conveying and adjustably delaying both analog and digital signals, either unidirectionally or bi-directionally depending on the number and positioning of varactor diodes along the coupling conductor.

It is accordingly an object of the invention to provide a transmission line having an adjustable signal path delay for conveying both analog and digital signals.

The claims portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

FIGS. 1 and 2 depict prior art adjustable delay transmission lines in schematic diagram form, FIG. 3 is a sectional side elevation view of an adjustable delay transmission line in accordance with the invention, FIG. 4 is a sectional end elevation view of the transmission line of FIG. 3.

Figure 8:
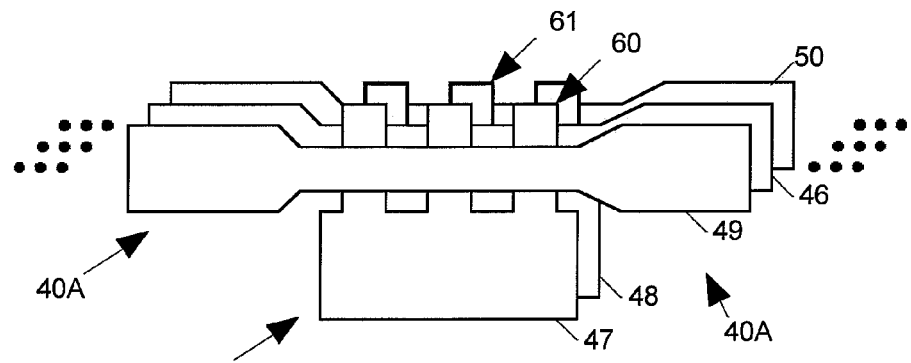
Figure 9:
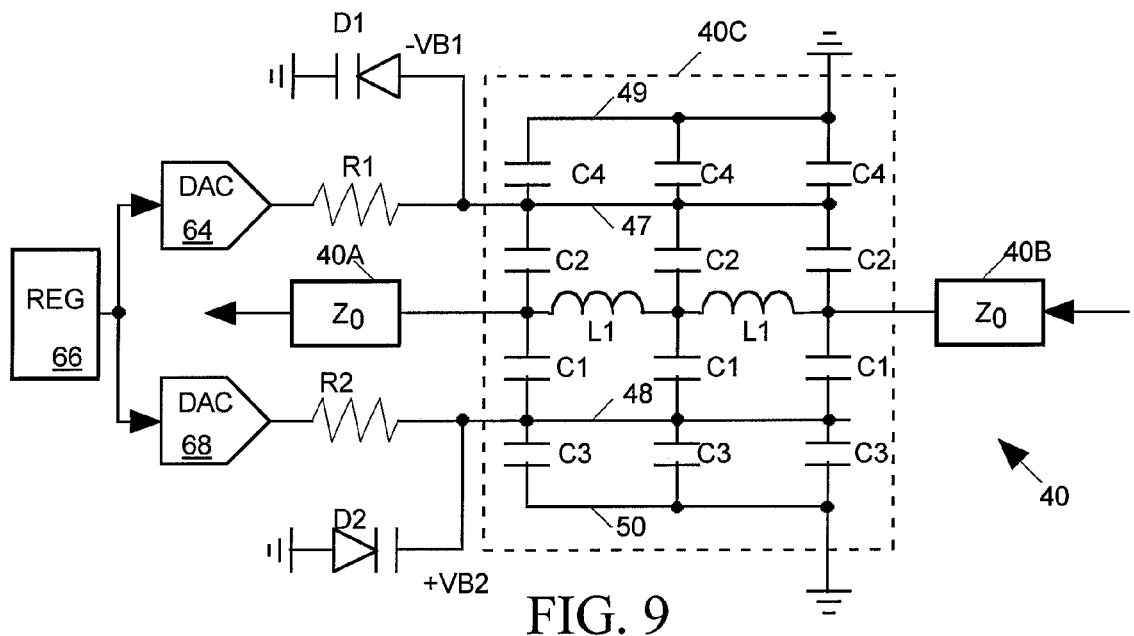
Figure 10:
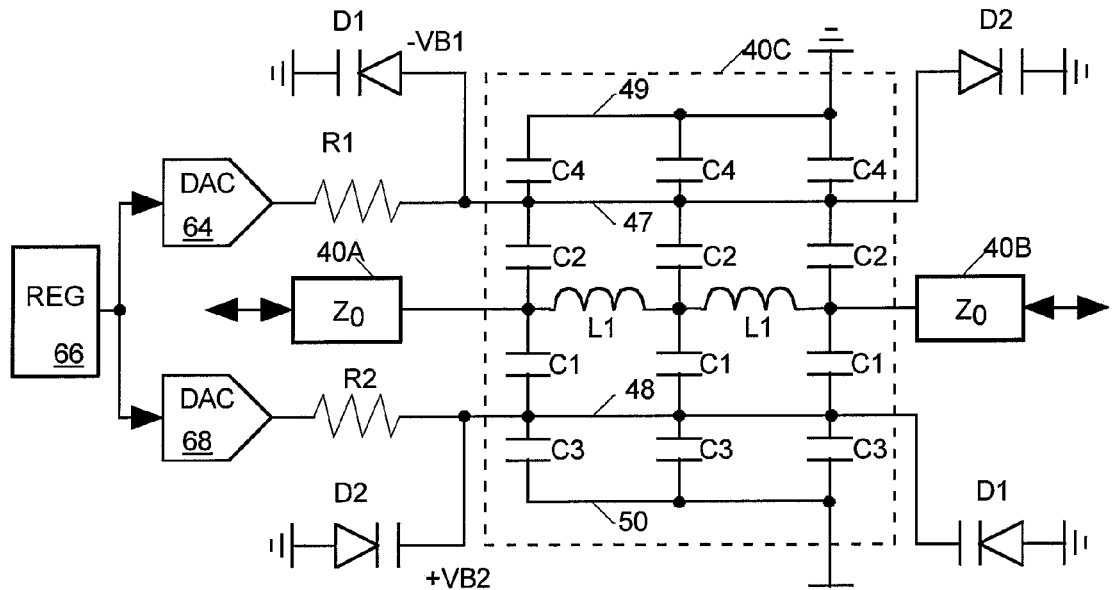
Figure 11:
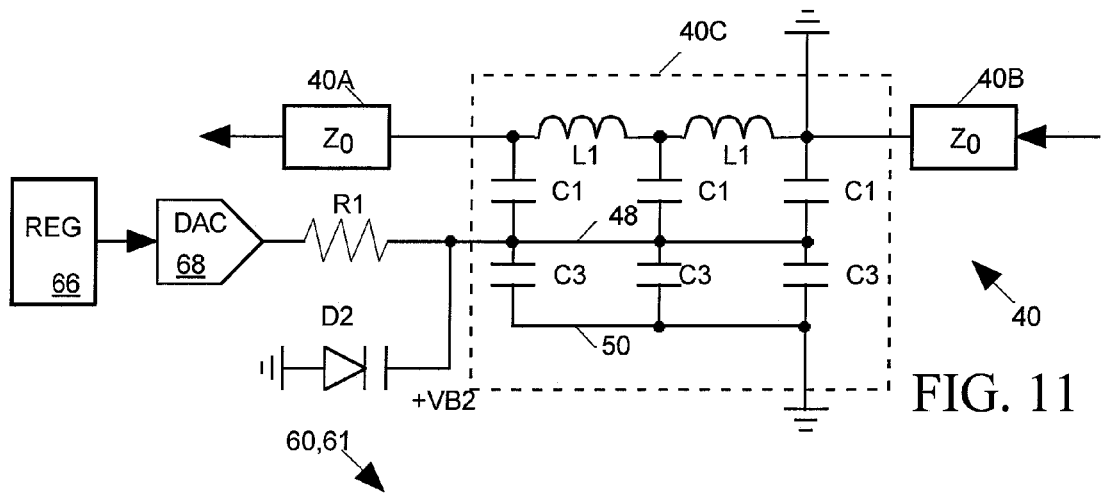
Figure 12:
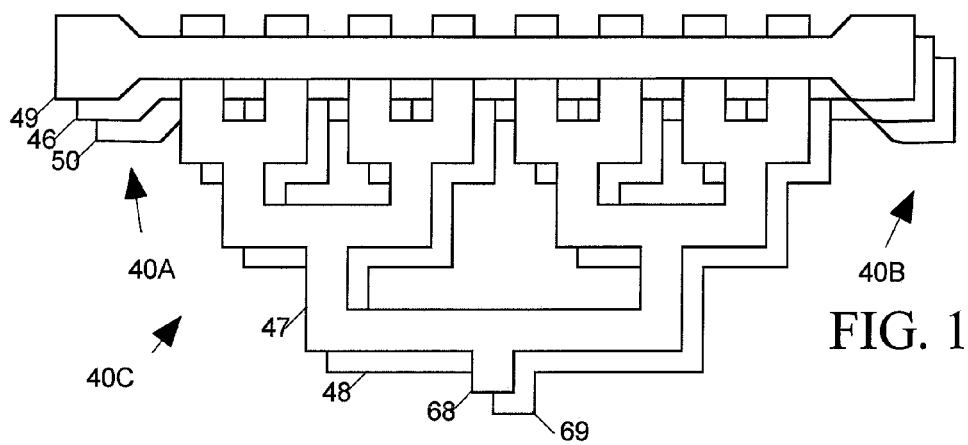
Figure 13:
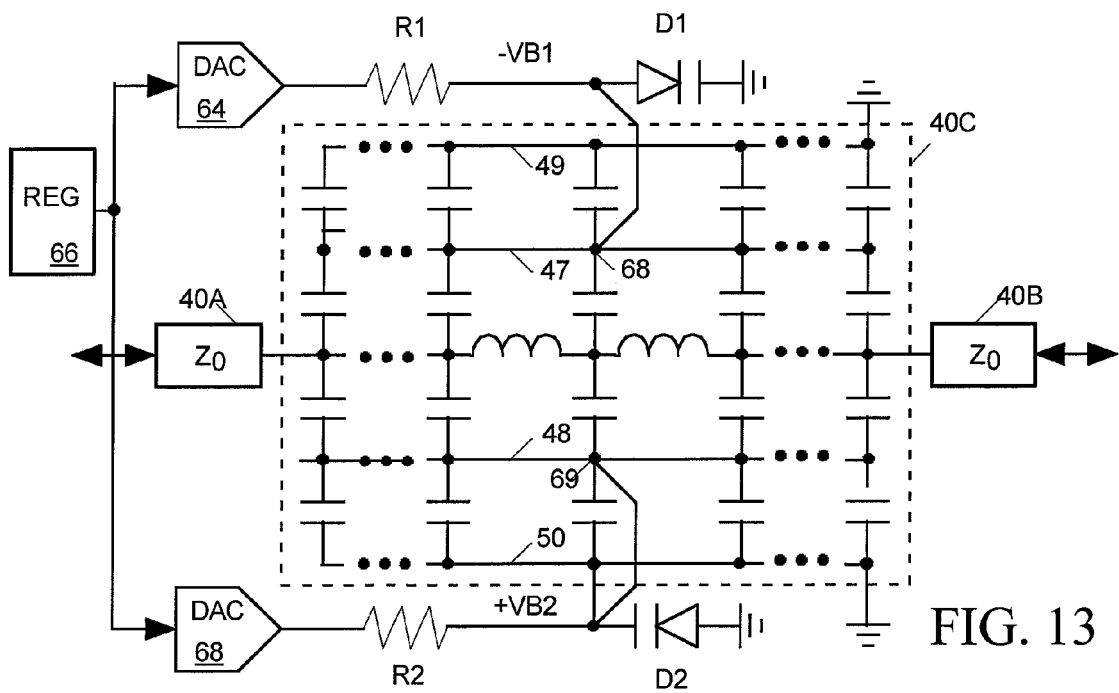
Figure 18:
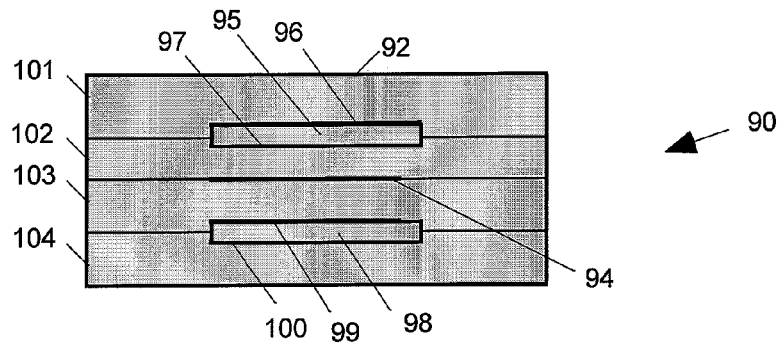
Figure 19:
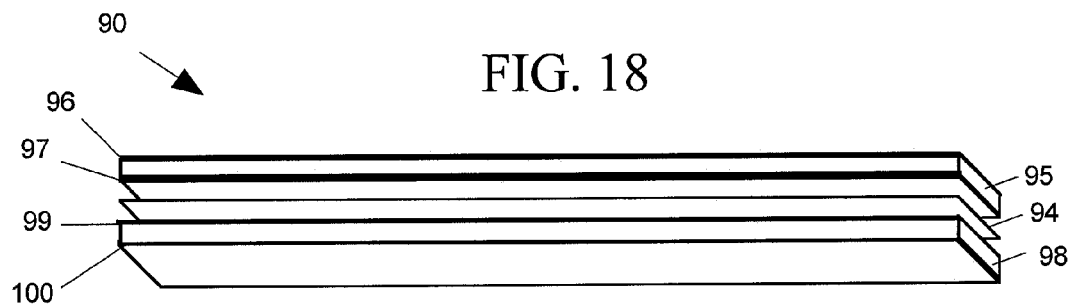
Figure 20:
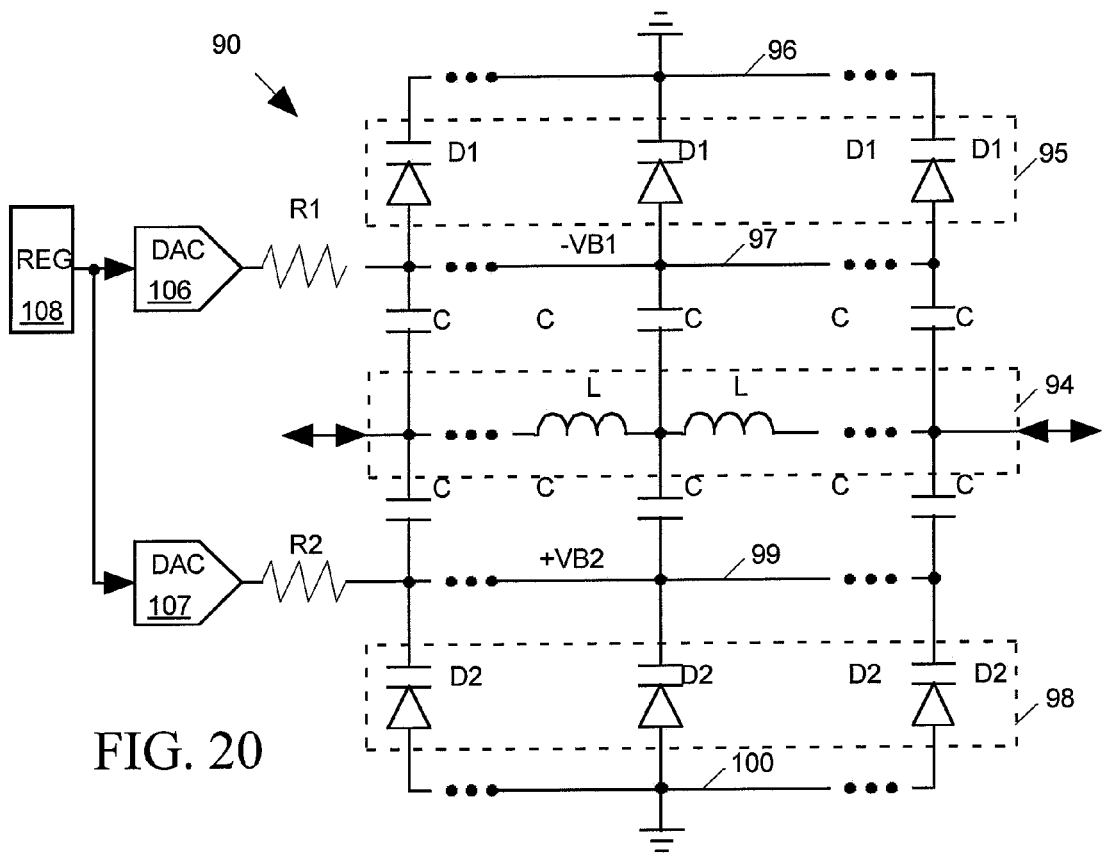

FIGS. 5–7 are partial sectional plan views of the transmission line of FIG. 3, FIG. 8 is a perspective view of portions of the transmission line of FIG. 3, FIGS. 9 and 10 depict in block and schematic diagram form equivalent circuit models of the transmission line of FIG. 3 connected to circuit devices for controlling its signal path delay, FIG. 11 depicts in block and schematic diagram form an equivalent circuit models of a transmission line in accordance with the invention, FIG. 12 is a perspective view of portions of a transmission line in accordance with the invention, FIG. 13 depicts in block and schematic diagram form an equivalent circuit model of the transmission line of FIG. 12 connected to circuit devices for controlling its signal path delay, FIG. 14 is a sectional side elevation view of an adjustable delay transmission line in accordance with the invention, FIG. 15 is a perspective view of portions of the transmission line of FIG. 14, FIGS. 16 and 17 depicts in block and schematic diagram form an equivalent circuit model of the transmission line of FIG. 14 connected to circuit devices for controlling its signal path delay, FIG. 18 is a sectional side elevation view of an adjustable delay transmission line in accordance with the invention, FIG. 19 is a perspective view of portions of the transmission line of FIG. 18, FIG. 20 depicts in block and schematic diagram form an equivalent circuit model of the transmission line of FIG. 18 connected to circuit devices for controlling its signal path delay, and FIGS. 21–24 are sectional elevation views of alternative embodiments of an adjustable delay transmission line in accordance with the invention.

DETAILED DESCRIPTION OF THE INVENTION

FIG. 3 is a partial sectional side elevation view of an adjustable delay transmission line 40 in accordance with the invention formed within a multiple layer insulating substrate 42. FIG. 4 is a partial sectional end elevation view of transmission lie 40. FIGS. 5–7 are partial sectional plan views of the transmission line and FIG. 8 is a perspective view of the portions of transmission line 40 that are embedded in substrate 42.

Referring to FIGS. 3–8, transmission line 40 includes a set of conductors 46–50 formed between layers 51–56 of insulating substrate 42. Transmission line 40 includes a signal conductor 46 formed between substrate layers 53 and 54 for conveying a high frequency digital or analog signal between two points with a signal path delay that is influenced by the conductor's shunt capacitance and series inductance. As described below, the adjustable capacitance of varactor diodes capacitively coupled to signal conductor 46 provide a measure of control of the signal path delay. Accordingly transmission line 40 also includes a pair of "coupling conductors" 47 and 48 formed on substrate layers 53 and 55, respectively, and having a set of fingers 60 and 61 horizontally crossing and vertically overlapping signal conductor 46. As discussed below, the capacitance between signal conductor 46 and fingers 60 and 61 capacitively couples the varactor diodes to signal conductor 46. Transmission line 40 further includes a conductive ground conductor 49 residing between substrate layers 51 and 52 and another conductive ground conductor 50 residing between substrate layers 55 and 56.

As best seen in FIGS. 6 and 8, signal conductor 46 has three sections, 46A–46C. Sections 46A and 46B are sized and spaced from ground conductors 49 and 50 so that transmission line 40 has a uniform distributed shunt capacitance and series inductance, over those sections. The central section 46C of signal conductor 46 is somewhat narrower than sections 46A and 46B so that the capacitance per unit length between section 46C and ground conductors 49 and 50 is somewhat smaller than the capacitance per unit length over sections 46A and 46B. In the preferred embodiment of the invention ground conductors 49 and 50 are similar in shape to signal conductor 46 although in alternative embodiments of the invention, they may have other shapes, For example they may be uniformly wide throughout.

FIG. 9 includes an equivalent circuit model of transmission line 40 and also depicts circuit devices for controlling its signal path delay. Since the shunt capacitances and series inductances of transmission line sections 40A and 40B are substantially uniform, these sections of transmission line 40 are suitably modeled by their "characteristic impedance" $Z_0$. The characteristic impedance of a uniform transmission line can be modeled as $$Z_0 = (L/C)^{1/2} \quad [3]$$

where L and C are the series inductance and shunt capacitance per unit length of the transmission line.

FIG. 9 models the central section 40C of transmission line 40 as a network of capacitors and inductors. FIG. 9 models the capacitance of transmission line section 40C between signal conductor 44 and fingers 60 and 62 of coupling conductors 47 and 48 as sets of capacitors C1 and C2, models the capacitance between ground and coupling conductors 47 and 48 as sets of capacitors C3 and C4, and models the inductance of transmission line section 40C of as a series of two inductors L1.

In accordance with the invention, a varactor diode D1 is connected between coupling conductor 47 and ground while a varactor diode D2 is connected between coupling conductor 48 and ground with reverse polarity to that of varactor diode D1. The capacitance of each varactor diode D1 and D2 varies with the voltage applied across it. A digital-to-analog converter (DAC) 64 controlled by data stored in a register 66 and drives coupling conductor 47 through a resistor R1 to provide a control voltage −VB1 on coupling conductor 47 for controlling the capacitance of varactor diode D1. Another DAC 68 controlled by data in register 66 and connected to coupling conductor 48 through a resistor R2, provides a control voltage +VB2 on coupling conductor 48 to control the capacitance of varactor diode D2. Control voltages −VB1 and +VB2 are suitably of equal magnitude but opposite in polarity.

Substrate 42 may be a printed circuit board, and an integrated circuit implementing varactor diodes D1 and D2, register 66 and DACs 64 and 68 may be mounted on substrate 42 with −VB1 and +VB2 outputs connected to coupling conductors 47 and 48 by conductive vias (not shown) passing vertically through substrate 42. Layers of substrate 42 may alternatively be formed directly on a surface of an integrated circuit implementing varactor diodes D1 and D2, register 66 and DACs 64 and 68. Varactor diodes D1 and D2 may alternatively be implemented as discrete components mounted on substrate 42.

Varactor diodes D1 and D2 add capacitance to the narrowed central portion 40C of transmission line 40 that can compensate for the reduction in capacitance in that area of the transmission line relative to that of sections 40A and 40B. Since data stored in register 66 controls control voltages VB1 and VB2, and since the control voltages control the capacitance of varactor diodes D1 and D2, the data in register 66 provides a measure of control over the capacitance per unit length of the narrowed portion of transmission line.

The velocity of propagation $V_p$ of a transmission line having capacitance C and L per unit length can be modeled by the expression:

$$V_p = (1/LC)^{1/2} \quad [4]$$

where f is the frequency of the signal passing over the signal path, l is the length of the path, and B is a constant that is a function of the material forming the path. Thus by controlling the capacitance C per unit length of the central portion 40C of transmission line 40, the data in register 66 provides a measure of control over the signal delay through that section of the delay line.

Equation [3] above shows that the characteristic impedance of a transmission line is also a function of transmission line capacitance. Thus while the data stored in register 66 influences transmission line by controlling transmission line capacitance, it also influences the transmission line's characteristic impedance. In the preferred embodiment of the invention, the widths (and therefore the capacitances C1–C4) of the signal conductor 46 and adjacent portions of ground conductors 49 and 50 of transmission line section 40C are preferably sized so that transmission line section 40C has substantially the same characteristic impedance $Z_0$ as the wider portions of the transmission line when the data in registers 66 sets varactor diodes D1 and D2 to some point within their capacitance ranges. Thus as the capacitances of varactor diodes D1 and D2 are increased or decreased to increase or decrease signal path delay, the characteristic impedance of the transmission line section 40C departs by only a relatively small amount from the characteristic impedance $Z_0$ of the other portions of the transmission line 40A and 40B.

In some applications it is more important to precisely control the characteristic impedance of a transmission line than its path delay. In such applications the data stored in register 66 can be chosen to finely adjust the transmission line's characteristic impedance rather that to closely control transmission line delay.

Since the capacitive coupling between signal path 46 and varactor diodes D1 and D2 provided by coupling conductors 47 and 48 is directional in nature, the points on coupling conductors 47 and 48 at which varactor diodes D1 and D2 should be connected depends on the direction in which signals pass over signal path 46. When signal pass from transmission line section 40B toward section 40A, then varactor diodes D1 and D2 are preferable connected to the ends of coupling conductors 47 and 48 nearest the junction of sections 40A and 40C illustrated in FIG. 9. When signal pass through transmission line in the other direction, varactor diodes D1 and D2 are preferable connected to ends of coupling conductors 47 and 48 near the junction of transmission line sections 40B and 40C.

When signals pass bi-directionally through transmission line 40, it is preferable to connect varactor diodes D1 and D2 to both ends of coupling conductors 47 and 48 as illustrated in FIG. 10 to ensure that the signal path delay is the same for signals traveling over the transmission line in either direction. Alternatively, single varactor diodes D1 and D2 may be connected to points on coupling conductors 47 and 48 horizontally midway between sections 46A and 46B of signal conductor 46.

Transmission line 40 preferably employs balanced varactor diodes D1 and D2 of opposite polarity to compensate for changes in varactor diode capacitance caused by the signal being conveyed by conductor 46. When a positive-going wave front passes down signal conductor 46, it induces a voltage increase on coupling conductors 47 and 48 which temporally increases the capacitance of varactor diode D1 but also decreases the capacitance of varactor diode D2. The capacitance changes in varactor diodes D1 and D2 tend to cancel one another so that the total transmission line capacitance per unit length remains unaffected by the wave front. However when the voltage swings of the signal being conveyed by transmission line 40 are sufficiently small, wavefronts of that signal do not substantially affect the capacitance of varactor diode D1. In such case is it possible to omit coupling conductor 47, varactor diode D1, ground conductor 49, resistor R1 and DAC 64 of FIGS. 8 and 9.

In such case the equivalent circuit for the transmission line would be as illustrated in FIG. 11.

FIG. 12 depicts a bi-directional version of the transmission line 40 of FIG. 3 in wherein its central section 40C is longer and wherein coupling conductors 47 and 48 include more fingers 60 and 61. FIG. 13 is an equivalent circuit diagram of the transmission line of FIG. 12. To provide similar capacitance for signal passing in either direction through signal conductor 46, varactor diodes D1 and D2 are connected to points 68 and 69 of coupling conductors 47 and 48 midway between transmission line sections 40A and 40B.

Varactor Diode-Coupled Ground Planes

FIG. 14 is a sectional elevation view of a transmission line 70 in accordance with the invention formed within a multiple layer insulating substrate 72 and FIG. 15 is a perspective view of the portions of transmission line 70 that are embedded in substrate 42. Referring to FIGS. 14 and 15, transmission line 70 includes a set of conductors 74–76 formed between layers 81–84 of insulating substrate 72. A signal conductor 74 for conveying a high frequency digital or analog signal is formed between substrate layers 82 and 83. A coupling conductor 75 resides between substrate layers 81 and 82 and a coupling conductor 76 resides between substrate layers 83 and 84. Conductor 74 and coupling conductors 75 and 76 are of uniform width and spacing from one another throughout their lengths so that transmission line 70 has uniform shunt capacitance C and series inductance L per unit distance throughout its length.

FIG. 16 includes an equivalent circuit diagram of transmission line 70 of FIG. 14 along with a circuit for controlling the signal path delay through the transmission line. A set of capacitors C represent the capacitance per unit length between signal path 74 and coupling conductors 75 and 76 and a set of inductors L represent the series inductance per unit length of signal conductor 74. Varactor diodes D1 and D2 link coupling conductors 75 and 76 to ground. A pair of DACs 88 and 89 driven by data in a register 90 and supply control voltages −VB1 and +VB2 of equal and opposite polarity to coupling conductors 75 and 76 via resistors R1 and R2.

The widths and spacing of signal path 74 and coupling conductors 75 and 76 are suitably selected so that transmission line 70 has a desired uniform characteristic impedance $Z_0$ when the capacitance of varactor diodes D1 and D2 are set to their mid range values. The signal path delay of transmission line 70 can then be increased or decreased by increasing or decreasing the magnitudes of control voltages −VB1 and +VB2.

When transmission line 70 is to convey a unidirectional signal, varactor diodes D1 and D2 are preferably placed at the end of the transmission line at which the signal exits as illustrated in FIG. 16. When transmission line 70 is to convey a bi-directional signal, varactor diodes D1 and D2 are preferably placed at the both ends of the transmission line at which the signal exits as illustrate in FIG. 6. For bidirectional signals, diodes D1 and D2 may alternatively be connected to coupling conductors 75 and 76 at a point midway between the end of transmission line 70.

FIG. 18 is a sectional elevation view of a transmission line 90 in accordance with the invention formed within a multiple layer insulating substrate 92 and FIG. 19 is a perspective view of the portions of transmission line 90 that are embedded in substrate 92. Referring to FIGS. 18 and 19, transmission line 90 includes a signal conductor 94 residing between substrate layers 102 and 103 for conveying a high frequency digital or analog signal. A thin film varactor diode 95 having a ground conductor 96 on its upper surface and a coupling conductor 97 on its lower surface resides between substrate layers 101 and 102. Another thin film varactor diode 98 having a coupling conductor 99 on its upper surface and a ground conductor 100 on its lower surface resides between substrate layers 103 and 104. Signal conductor 94, thin film varactors 95 and 98, ground conductor conductors 96 and 100, and coupling conductors 97 and 99 are of uniform width and spacing throughout their lengths so that there is uniform shunt capacitance C per unit length between signal conductor 94 and coupling conductors 96 and 99 and so that signal conductor 94 has uniform series inductance L per unit distance through out its length.

FIG. 20 includes an equivalent circuit diagram of transmission line 90 of FIG. 18 along with circuit devices for controlling the signal path delay through the transmission line. A set of capacitors C represent the capacitance per unit length between signal conductor 94 and coupling conductors 97 and 99 and a set of inductors L represent the series inductance per unit length of signal conductor 94. Thin film varactor diode 95 links ground conductor 96 and coupling conductor 97 while thin film varactor diode 98 links coupling conductor 99 to ground conductor 100. A pair of DACs 106 and 108 controlled by data stored in a register 108 supply control voltages −VB1 and +VB2 of equal and opposite polarity to coupling conductors 97 and 99 via resistors R1 and R2.

The widths and spacing of signal conductor 94, coupling conductors 97 and 99, thin film varactor diodes 95 and 98 and ground conductors 96 and 100 are suitably designed so that transmission line 70 has a desired uniform characteristic impedance $Z_0$ when the capacitances of thin film varactor diodes D1 and D2 are set to their mid range values. The signal path delay of transmission line 90 can then be increased or decreased by increasing or decreasing the magnitudes of control voltages −VB1 and +VB2.

Coaxial Transmission Lines

Figure 21:
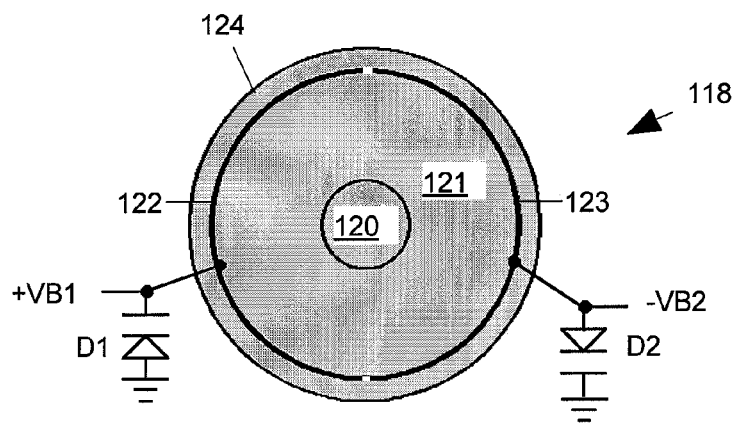

FIG. 21 includes a sectional view of a coaxial cable 118 in accordance with the invention having an adjustable signal path delay. Cable 118 contains an inner conductor 120 for carrying a high frequency signal, a layer of insulating material 121 surrounding conductor 120, a pair of thin conductive coupling layers 122 and 123 covering opposite sides of insulating layer 121, and an insulating outer sheath 124. A varactor diode D1 is connect between an end of coupling layer 122 and ground and a similar varactor diode D2 is connected with opposite polarity between coupling layer 123 and ground. A control voltage $+V_{BIAS}$ and $-V_{BIAS}$ of opposite polarity are applied across varactor diodes D1 and D2. The magnitudes of control voltages $+V_{BIAS}$ and $-V_{BIAS}$ control the capacitance of varactor diodes D1 and D2 and therefore control the signal path delay through coaxial cable 118. When coaxial cable 118 is to convey a signal in only one direction, varactor diodes are suitably connected at the end of cable 118 from which the signal departs. When coaxial cable 118 is to convey a bidirectional signal, copies of varactor diodes D1 and D2 are suitably connected at the both ends of cable 118.

Figure 22:
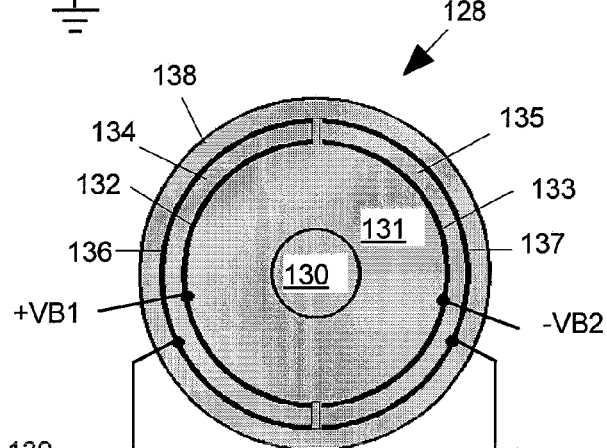

FIG. 22 includes a sectional view of a coaxial cable 128 in accordance with the invention having an adjustable signal path delay. Cable 128 includes an inner signal conductor 130 for carrying a high frequency signal and a layer of insulating material 131 surrounding signal conductor 130. A pair of thin conductive coupling layers 132 and 133 cover opposite sides of insulating layer 131, a pair of thin film varactor diodes 134 and 135 cover coupling layers 132 and 133, and a pair of thin conductive ground layers 136 and 137 cover layers 134 and 135. Cable 128 also includes an outer insulating layer 138. Thin film varactor layer 134 links coupling layer 132 to ground layer 136 with a diode polarity opposite to the diode polarity with which thin film varactor layer 135 links coupling layer 133 to ground conductor layer 137. With ground layers 136 and 137 grounded at ends of cable 128, a positive control voltage +VB1 applied to coupling layer 132 and a negative control voltage −VB2 applied to coupling layer 133 control the capacitance of varactor diode layers 133 and 134 and therefore control the signal path delay through coaxial cable 128. Coaxial cable 128 is suitable for conveying bidirectional signals.

Figure 23:
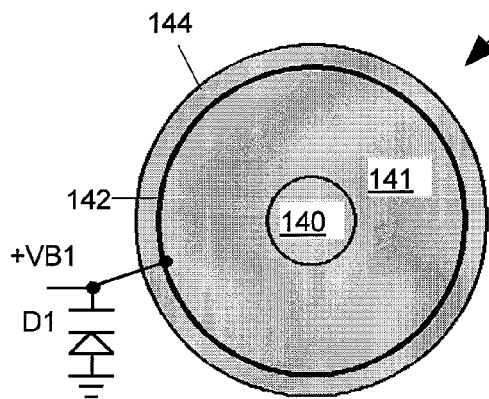

FIG. 23 illustrates a coaxial cable 139 including a central conductor 140 surrounded by an insulating layer 141, a conductive coupling layer 142 and an outer insulating layer 144. A varactor diode D1 links an end of coupling layer 142 to ground and a control voltage +VB1 is applied across diode D1 to control its capacitance and to in turn control the signal path delay of coaxial cable 139. Diodes D1 may be connected to opposite ends of coupling layer 142 when cable 139 is to convey a bi-directional signal. Coaxial cable 139 can be employed to convey signals with adjustable signal path delay in lieu of cable 118 of FIG. 21 when the peak-to-peak voltage of the signal being conveyed by conductor 140 is not large enough to substantially affect the capacitance of diode D1.

Figure 24:
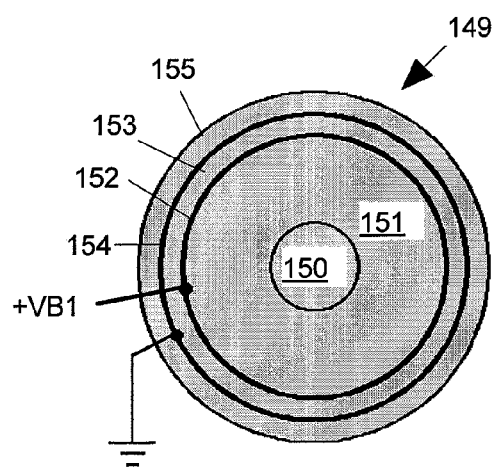

FIG. 24 illustrates a coaxial cable 149 including a central conductor 150 surrounded by an insulating layer 151, a conductive coupling layer 152, a thin film varactor diode layer 153, a conductive ground layer 154, and an outer insulating layer 155. Ground layer 154 is grounded and a control voltage +VB1 is applied to coupling layer 152 to control the capacitance of thin film varactor layer 153. Coaxial cable 149 can be employed to convey signals with adjustable signal path delay in lieu of cable 128 of FIG. 22 when the peak-to-peak voltage of the signal being conveyed by conductor 150 is not large enough to substantially affect the capacitance of thin film varactor layer 153.

Thus has been shown and described various versions of a transmission line in accordance with the invention in which one or more varactor diodes are capacitively coupled to a signal conductor. The varactor diodes provide a measure of control over the transmission line's shunt capacitance and therefore a measure of control of the transmission line's signal path delay.

While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. A method of selectively controlling a transmission delay of at least a portion of an electrically conductive signal line, the method comprising:

applying a first control signal through a first conductor to a first variable capacitor, wherein the first control signal controls an amount of capacitance of the first variable capacitor, the first conductor being electrically insulated from and disposed along the at least a portion of the electrically conductive signal line; and capacitively coupling the first variable capacitor to the signal line through a first distributed capacitance distributed substantially uniformly along the at least a portion of the signal line, wherein the first distributed capacitance comprises the first conductor.

2. The method of claim 1, wherein the first variable capacitor is disposed adjacent a first end of the signal line.

3. The method of claim 1 further comprising:

applying the first control signal through the first conductor to a second variable capacitor, wherein the first control signal further controls an amount of capacitance of the second variable capacitor; and capacitively coupling the second variable capacitor to the signal line through the first distributed capacitance.

4. The method of claim 3, wherein:

the first variable capacitor is disposed adjacent a first end of the signal line, and the second variable capacitor is disposed adjacent a second end of the signal line.

5. The method of claim 1, wherein the first variable capacitor comprises a varactor diode.

6. The method of claim 5, wherein the varactor diode comprises a thin film varactor diode.

7. The method of claim 1 further comprising capacitively coupling a second variable capacitor to the signal line through a second distributed capacitance distributed substantially uniformly along at least a second portion of the signal line.

8. The method of claim 7, wherein the at least a portion of the signal line and the at least a second portion of the signal line are substantially the same portion of the signal line.

9. The method of claim 7 further comprising applying a second control signal to the second variable capacitor, wherein the second control signal controls an amount of capacitance of the second variable capacitor.

10. The method of claim 9, wherein the second variable capacitor comprises a second conductor electrically insulated from and disposed along the second portion of the signal line.

11. The method of claim 10, wherein the applying a second control signal to the second variable capacitor comprises applying the second control signal through the second conductor.

12. A method of selectively controlling a transmission delay of at least a portion of an electrically conductive signal line, the method comprising:

applying a first control signal to a first variable capacitor, wherein the first control signal controls an amount of capacitance of the first variable capacitor;

capacitively coupling the first variable capacitor to the signal line through a first distributed capacitance distributed substantially uniformly along at least a first portion of the signal line;

applying a second control signal to a second variable capacitor, wherein the second control signal controls an amount of capacitance of the second variable capacitor; and capacitively coupling the second variable capacitor to the signal line through a second distributed capacitance distributed substantially uniformly along at least a second portion of the signal line.

13. The method of claim 12, wherein:

the first variable capacitor comprises a first conductor electrically insulated from and disposed along the at least a first portion of the electrically conductive signal line, and the applying a first control signal comprises applying the first control signal through the first conductor to the first variable capacitor.

14. The method of claim 13, wherein:

the second variable capacitor comprises a second conductor electrically insulated from and disposed along the at least a second portion of the electrically conductive signal line, and the applying a second control signal comprises applying the second control signal through the second conductor to the second variable capacitor.

15. The method of claim 12, wherein the at least a first portion of the signal line and the at least a second portion of the signal line are substantially the same portion of the signal line.

* * * * *